United States Patent [19]

Schwarz et al.

[11] 4,371,972
[45] Feb. 1, 1983

[54] ADAPTIVE DELTA MODULATOR

[75] Inventors: Dieter Schwarz; Ralf Misner, both of Nuremberg, Fed. Rep. of Germany; Johannes W. Glasbergen, Bussum, Netherlands

[73] Assignee: U.S. Philips Corporation, New York, N.Y.

[21] Appl. No.: 227,833

[22] Filed: Jan. 23, 1981

[30] Foreign Application Priority Data

Jan. 29, 1980 [DE] Fed. Rep. of Germany ....... 3002960

[51] Int. Cl.³ .......................................... H03K 13/22
[52] U.S. Cl. .................... 375/30; 332/11 D; 375/5
[58] Field of Search .................. 375/27, 28, 29, 30, 375/32, 34, 35.5; 179/15.55 R, 15.55 T; 332/11 D; 340/347 AD, 347 DD

[56] References Cited

U.S. PATENT DOCUMENTS

| | | | |
|---|---|---|---|
| 3,516,022 | 6/1970 | Brolin | 332/11 D |
| 3,746,990 | 7/1973 | Diberder et al. | 332/11 D |
| 3,855,555 | 12/1974 | Burkhard et al. | 332/11 D |
| 4,142,066 | 2/1979 | Ahamed | 332/11 D |
| 4,215,311 | 7/1980 | Kittel et al. | 375/30 |

Primary Examiner—Benedict V. Safourek
Assistant Examiner—Stephen Chin
Attorney, Agent, or Firm—Thomas A. Briody; William J. Streeter; Edward W. Goodman

[57] ABSTRACT

An adaptive delta modulator must produce at its output a periodic 0-1 sequence when the input signal (w) to be coded assumes zero value. The delta modulator of the present invention is provided with a generator (GE) to produce a periodic 0-1 sequence which is transmitted to the receiver instead of the delta coded signal when the input signal to be coded assumes zero value. This generator (GE) is switched to the output line of the delta modulator at the instant at which the output voltage (Us) of a filter (IN) in the feedback path of the delta modulator, for determining the instantaneous quantizing unit of the delta modulator, assumes zero value. If this filter (IN) is implemented with digital components, the generator (GE) is triggered by the output pulses of a gate (G1) whose inputs are connected to the respective locations of the input signal storing means of the filter (IN). A delay line (V) prevents triggering of the generator (GE) at extremely short pauses in the input signal (w) to be coded.

3 Claims, 2 Drawing Figures

4,371,972

ADAPTIVE DELTA MODULATOR

BACKGROUND OF THE INVENTION

An adaptive delta modulator for producing a delta coded output signal in response to an input signal, comprising a filter whose input signal in a pulse sequence derived from said delta coded output signal by a logic processing circuit and whose output voltage determines the instantaneous quantizing unit of said delta modulator.

Such a delta modulator is well known and disclosed in, for example, German patent application No. 28 49 001. Owing to the unavoidable tolerance when implemented with semiconductor components—this delta modulator does not produce a periodic 0–1 sequence at its output when the input signal to be coded assumes zero value. This causes an increase of the idle channel noise in the decoded signal at the receiving end and an aggravation of the clock recovery.

SUMMARY OF THE INVENTION

The invention has for its object to provide an adaptive delta modulator of the type set forth in the preamble which has a simple structure and yet reliably supplies a periodic 0–1 sequence when the input signal to be coded assumes zero value.

The adaptive delta modulator according to the invention is characterized in that it further comprises a generator for producing a periodic 0–1 sequence and means for transmitting said periodic 0–1 sequence instead of said delta coded output signal as long as a filter output voltage has zero value.

These measures require considerably less circuit-technical design efforts and cost than the obvious measure of determining the level of the input signal to be coded and producing, in dependence on this level, a periodic 0–1 sequence at the delta modulator output.

DESCRIPTION OF THE DRAWING

An embodiment of the invention will now be further described with reference to the accompanying drawing, in which.

DESCRIPTION OF THE PREFERRED EMBODIMENT

Figure 1:
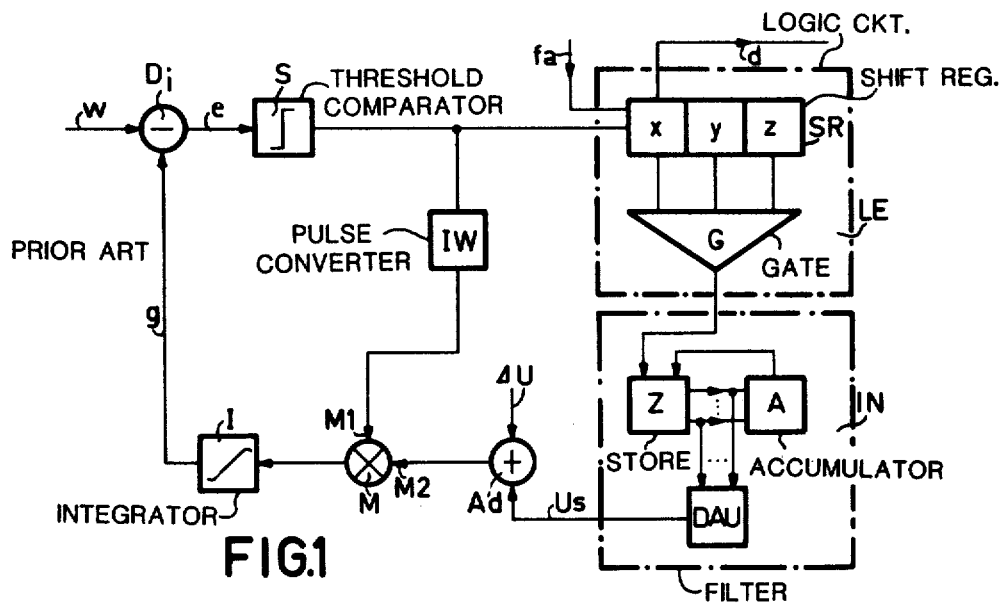
FIG. 1 shows a prior art adaptive delta modulator.

In FIG. 1, reference w denotes the analog input signal to be coded and reference d denotes the delta coded output signal of the delta modulator. A decoded signal g is derived from output signal d by means of a logic circuit LE, a filter IN, an adder Ad, a multiplier M, a pulse converter IW and an integrator I. The signal g is applied together with the input signal w to a difference stage Di. A threshold comparator S converts the sign of the difference between the signal w and g into a binary signal which is sampled at a rate fa. The sequence of these samples represents the delta coded signal d. It is transmitted to the receiver and simultaneously shifted at the transmitting end through a shift register SR included in logic circuit LE.

The output from each stage x, y and z of shift register SR is connected to respective inputs of a gate G. This gate G produces a pulse at its output only when the same binary values are present at all three inputs. The output pulses of Gate G are applied to filter IN. The function of filter IN is to produce at any instant an output voltage Us which is proportional to the number of pulses applied to the input of the filter in a preceding time interval of predetermined length.

Such a filter may be either a RC integrating network or, as in FIG. 1, its counterpart when implemented with digital components.

The output voltage Us of filter IN is added to a voltage $\Delta U$ by adder Ad and the sum is multiplied in multiplier M by the sign of the difference between the signals w and g. The required sign pulse is produced by a pulse converter IW.

The sum of the signals $\Delta U$ and Us is referred to as instantaneous quantizing unit. It is the amount by which the decoded signal g increases or decreases at the clock instants.

When the input signal w becomes zero, the coded signal d must consist, for an ideal delta modulator, of aperiodic 0–1 sequence. With a real delta modulator it may, however, happen that two equal binary values follow immediately after each other. Since at a periodic 0–1 sequence as well as the indicated deviation therefrom (because of the operating mode of the gate G) logic circuit LE does not transmit pulses to filter IN, and this filter tends—with its own time constant—to a state in which its output voltage Us goes to the zero value.

If, therefore, the smallest instantaneous quantizing unit is used during coding or if the equivalent case occurs in which output voltage Us of filter IN is zero, this is an indication, also with a real delta modulator, that the idle signal or constant signal condition has occurred at the input of the delta modulator. In accordance with the invention this circumstance is used for switching-on a generator to profuce a periodic 0–1 sequence.

Figure 2:
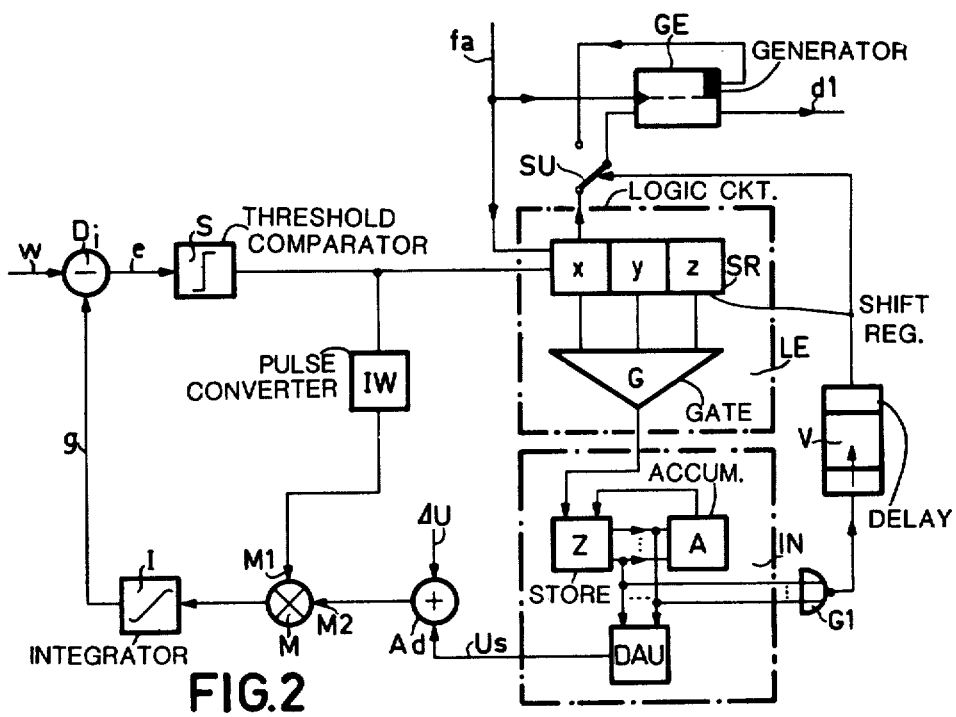
FIG. 2 shows a modulator comprising the improvements of the invention.

FIG. 2 shows such a generator GE which has the form of a flip-flop. A controllable switch SU connects either the output terminal of a delta modulator according to FIG. 1 or the $\overline{Q}$-output of the flip-flop to the data input of the flip-flop. The clock signal used in this delta modulator in FIG. 1, which has a clock frequency fa, is also applied to the clock input of the flip-flop. When controllable switch SU is in the position shown in the drawing, the output signal d1 of the delta modulator of FIG. 2 corresponds bitwise to the signal d of FIG. 1. If, however, controllable switch SU is set to its other position by means of a control pulse, the $\overline{Q}$-output of the flip-flop is fed back to its input and the signal d1 consists of a periodic 0–1 sequence.

Switch SU receives the control pulse exactly at the instant at which output voltage Us of filter IN assumes the value zero. This might be realized by including an additional threshold comparator whose input receives output voltage US of filter IN and whose output signal is applied to the control input of switch SU. If, however, filter IN is a digital filter, for instance as, shown in FIGS. 1 and 2, it is possible to avoid the consequence of inaccuracies which may occur in the digital-to-analog conversion, by sensing all locations of the means included in filter IN for storing the binary pulse sequence at the output of G with the aid of a logic gate and by thereafter switching-on generator GE, depending on the sensing results. FIG. 2 shows a logic gate in the form of a NOR-gate G1 producing a binary "1" when a binary "0" is applied to all its inputs. Gate G1 interrogates the position of a counter Z which in conjunction with an accumulator A and a digital-to-analog converter DAU constitutes filter IN. If counter Z is a synchronous counter, a separate gate G1 is not necessary as such a counter does already comprise a gate, by means of which all storage locations can be interrogated.

To prevent generator GE from being switched on at very short pauses in signal w, a delay line V is provided which only delays the leading edge of a pulse from gate G1. If, for example, an interval in the signal w is shorter than the adjusted delay of delay line V, no pulse at all is passed on to controllable switch SU. If the delay line were omitted, the delta coded signal would result at the receiving end in "clipped" speech when the signal w to be coded is a speech signal.

We claim:

1. An adaptive delta modulator for producing a delta coded output signal in response to an input signal, said delta modulator including a filter whose input signal is a pulse sequence derived from said delta coded output signal by a logic processing circuit and whose output voltage determines the instantaneous quantizing unit of said delta modulator, characterized in that said delta modulator further comprises a generator for producing a periodic 0-1 sequence, means coupled to the output of said filter for detecting when the output voltage therefrom has zero value, and means coupled to said detecting means for alternatively coupling the output of said generator to the output of said adaptive delta modulator instead of said delta coded output signal in response to said detecting means.

2. An adaptive delta modulator as claimed in claim 1, in which said filter is a digital filter having means for storing said pulse sequence, characterized in that said detecting means include a gate for detecting the zero value of said filter output voltage, said gate having a plurality of inputs respectively connected to separate locations of said storing means and producing a control signal for said coupling means for connecting said generator to the delta modulator output.

3. An adaptive delta modulator as claimed in claim 1 or 2, characterized in that said adaptive delta modulator further includes delay means coupled between said detecting means and said coupling means whereby the application of said 0-1 sequence to the delta modulator output is delayed with respect to the instant at which said filter output voltage assumes zero value.

* * * * *